(12) United States Patent
Saiki

(10) Patent No.: US 12,362,212 B2
(45) Date of Patent: Jul. 15, 2025

(54) COMPUTER-READABLE RECORDING MEDIUM, SUBSTRATE BONDING SYSTEM, AND SUBSTRATE BONDING METHOD

(71) Applicant: Tokyo Electron Limited, Tokyo (JP)

(72) Inventor: Keiichi Saiki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 130 days.

(21) Appl. No.: 18/180,995

(22) Filed: Mar. 9, 2023

(65) Prior Publication Data

US 2023/0290659 A1    Sep. 14, 2023

(30) Foreign Application Priority Data

Mar. 10, 2022 (JP) ................. 2022-037477

(51) Int. Cl.
*H01L 21/67* (2006.01)
*H01L 21/683* (2006.01)

(52) U.S. Cl.
CPC .. *H01L 21/67288* (2013.01); *H01L 21/67092* (2013.01); *H01L 21/67259* (2013.01); *H01L 21/6704* (2013.01); *H01L 21/67207* (2013.01); *H01L 21/6838* (2013.01)

(58) Field of Classification Search
CPC ....................................... H01L 21/67
See application file for complete search history.

(56) References Cited

U.S. PATENT DOCUMENTS

2020/0273835 A1* 8/2020 Inamasu ............... H01L 21/681
2022/0065618 A1* 3/2022 Kim .................... G01N 21/9501

FOREIGN PATENT DOCUMENTS

JP    2010-9212 A   *  1/2010
JP    2020-141034 A    9/2020

* cited by examiner

*Primary Examiner* — Jeffry H Aftergut
(74) *Attorney, Agent, or Firm* — Chrisman Gallo Tochtrop LLC

(57) ABSTRACT

A computer-readable recording medium having stored thereon computer-executable instructions that, in response to execution on a computer, cause a processing to be performed is provided. The processing includes acquiring displacement data of multiple points on a surface of a substrate held by a chuck; specifying a distribution of displacements of the surface based on the acquired displacement data; and determining a type of a foreign matter based on the specified distribution.

9 Claims, 16 Drawing Sheets

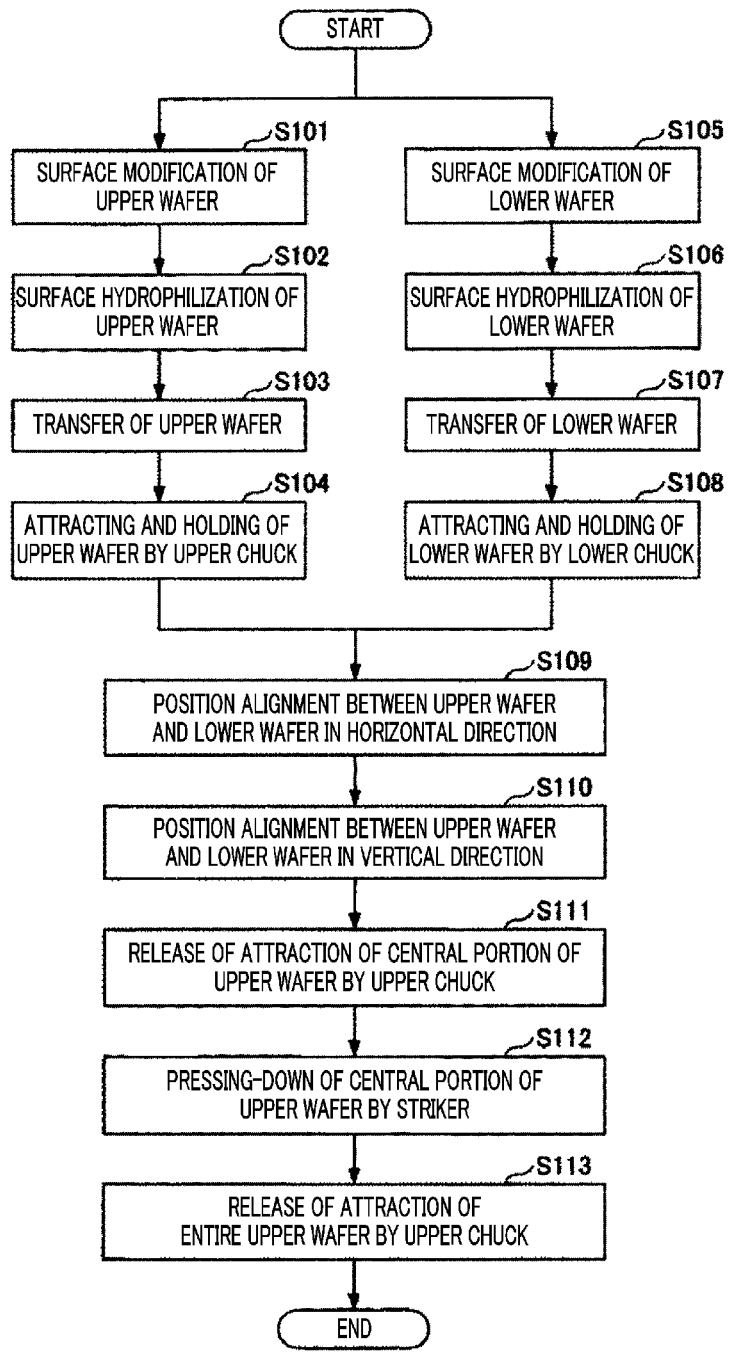

COMPUTER-READABLE RECORDING MEDIUM, SUBSTRATE BONDING SYSTEM, AND SUBSTRATE BONDING METHOD

CROSS-REFERENCE TO RELATED APPLICATION

This application claims the benefit of Japanese Patent Application No. 2022-037477 filed on Mar. 10, 2022, the entire disclosure of which is incorporated herein by reference.

TECHNICAL FIELD

The various aspects and embodiments described herein pertain generally to a computer-readable recording medium, a substrate bonding system, and a substrate bonding method.

BACKGROUND

Patent Document 1 describes a substrate processing apparatus having a chuck configured to attract and hold a substrate, an observation unit configured to observe a plurality of positions on a second surface of the substrate attracted to and held by the chuck opposite to a first surface in contact with the chuck, and an analysis unit configured to analyze observation results of the plurality of positions. When a singularity regarding a height from a chuck surface on which the substrate is attracted and held exists on the second surface, the analysis unit specifies the position of the singularity on the chuck.

Patent Document 1: Japanese Patent Laid-open Publication No. 2020-141034

SUMMARY

In one exemplary embodiment, there is provided a computer-readable recording medium having stored thereon computer-executable instructions that, in response to execution on a computer, cause a processing to be performed. The processing includes acquiring displacement data of multiple points on a surface of a substrate held by a chuck; specifying a distribution of displacements of the surface based on the acquired displacement data; and determining a type of a foreign matter based on the specified distribution.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8 is a flowchart illustrating a part of processings performed by the bonding system according to the exemplary embodiment;

FIG. 10A and FIG. 1013 are diagrams illustrating examples of displacement data according to the exemplary embodiment;

DETAILED DESCRIPTION

Figure 1:
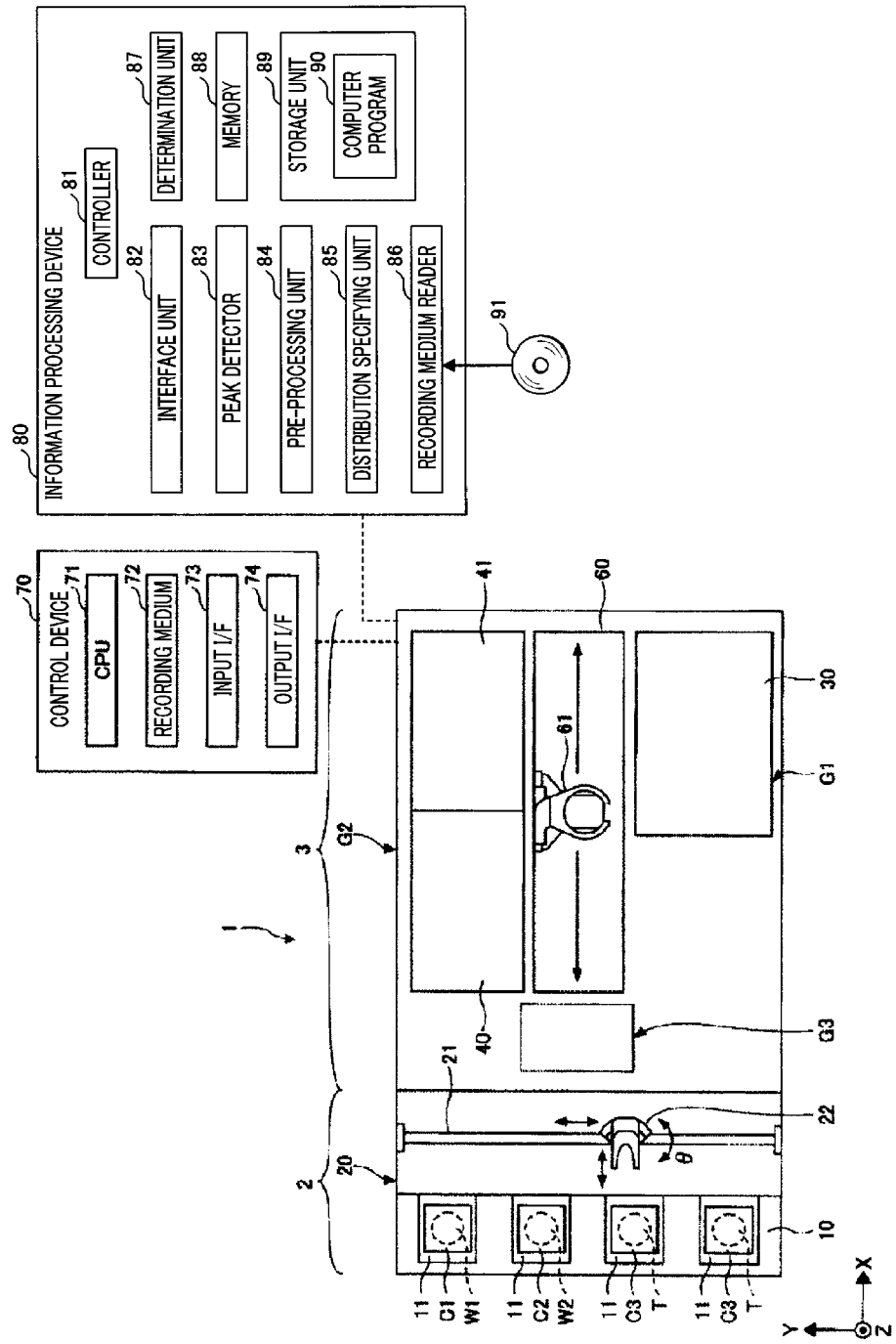
FIG. 1 is a plan view illustrating a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same or corresponding parts will be assigned same or corresponding reference numerals, and redundant description will be omitted. In the following description, the X-axis direction, the Y-axis direction and the Z-axis direction are orthogonal to each other, and the X-axis and Y-axis directions are horizontal directions whereas the Z-axis direction is a vertical direction. A rotational direction around a vertical axis is also referred to as "θ direction." In the present specification, below means vertically below, and above means vertically above.

Figure 2:
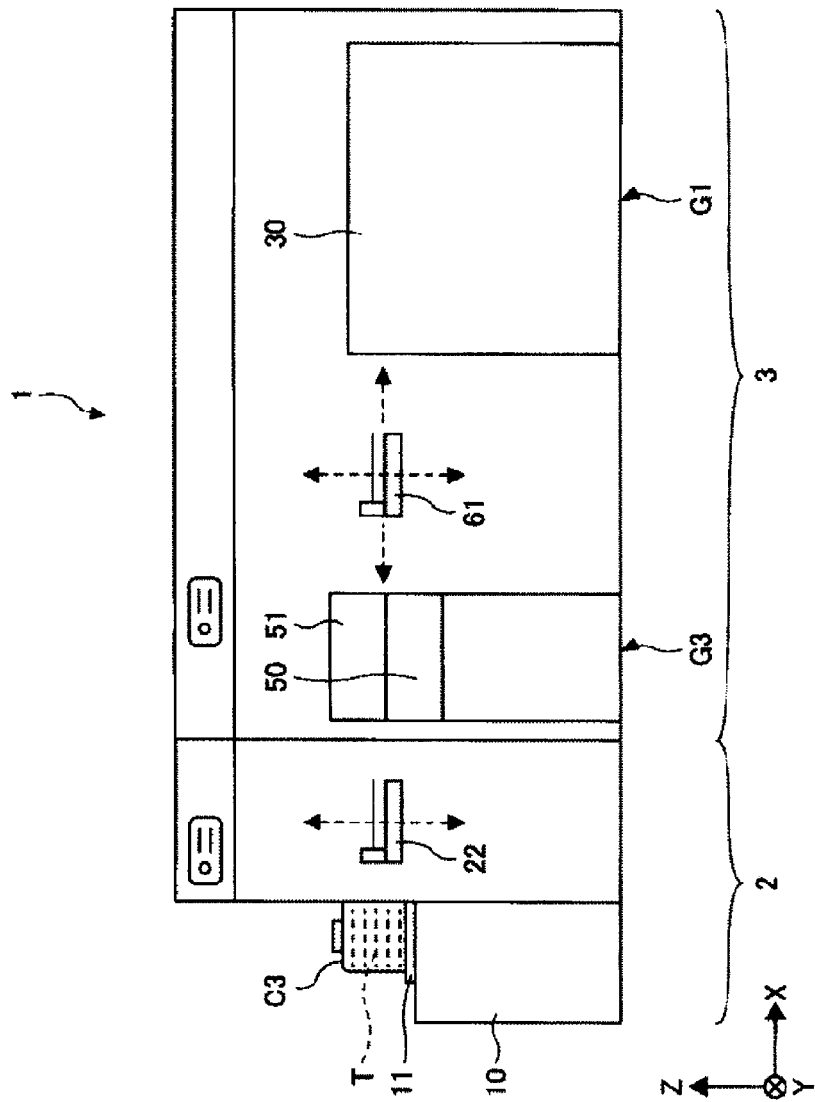
FIG. 2 is a side view illustrating the bonding system according to the exemplary embodiment.
Figure 3:
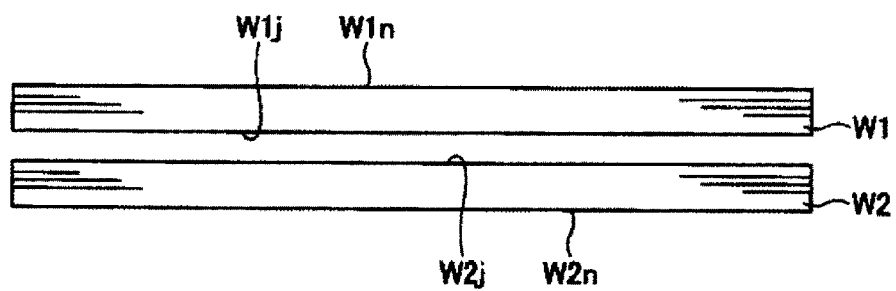
FIG. 3 is a side view illustrating a state of a first substrate and a second substrate before they are bonded according to the exemplary embodiment.

FIG. 1 is a plan view illustrating a bonding system according to an exemplary embodiment. FIG. 2 is a side view illustrating the bonding system according to the exemplary embodiment. FIG. 3 is a side view illustrating a state before a first substrate and a second substrate are bonded according to the exemplary embodiment. A bonding system 1 shown in FIG. 1 is configured to form a combined substrate T (see FIG. 7B) by bonding a first substrate W1 and a second substrate W2.

The first substrate W1 is, for example, a silicon wafer or a compound semiconductor wafer on which multiple electronic circuits are formed. The second substrate W2 is, for example, a bare wafer on which no electronic circuit is formed. The first substrate W1 and the second substrate W2 have approximately the same diameter. Alternatively, the second substrate W2 may have an electronic circuit formed thereon.

In the following description, the first substrate W1 will sometimes be referred to as "upper wafer W1," the second substrate W2 will sometimes be referred to as "lower wafer W2", and the combined substrate T will sometimes be referred to as "combined wafer T". Further, in the following description, as illustrated in FIG. 3, among surfaces of the upper wafer W1, a surface to be bonded to the lower wafer W2 will be referred to as "bonding surface W1j", and a surface opposite to the bonding surface W1j will be referred to as "non-bonding surface W1n". Further, among surfaces of the lower wafer W2, a surface to be bonded to the upper wafer W1 will be referred to as "bonding surface W2j", and a surface opposite to the bonding surface W2j will be referred to as "non-bonding surface W2n."

As depicted in FIG. 1, the bonding system 1 includes a carry-in/out station 2 and a processing station 3. The carry-in/out station 2 and the processing station 3 are arranged in the order of the carry-in/out station 2 and the processing station 3 along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Respectively provided on the placing plates 11 are cassettes C1 to C3 each of which accommodates therein a plurality of (e.g., 25 sheets of) substrates horizontally. By way of example, the cassette C1 accommodates therein a plurality of upper wafers W1; the cassette C2, a plurality of lower wafers W2; and the cassette C3, a plurality of combined wafers T.

The transfer section 20 is provided adjacent to the positive X-axis side of the placing table 10. Provided in the transfer section 20 are a transfer path 21 extending in the Y-axis direction and a transfer device 22 configured to be movable along this transfer path 21. The transfer device 22 is configured to be movable in the X-axis direction as well as in the Y-axis direction and pivotable around the Z-axis. The transfer device 22 serves to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 disposed on the placing plates 11 is not limited to the shown example. In addition to the cassettes C1, C2 and C3, a cassette or the like for collecting a defective substrate may also be disposed on the placing plate 11.

The processing station 3 is provided with a plurality of processing blocks, for example, three processing blocks G1, G2, and G3 equipped with various apparatuses. The first processing block G1 is disposed on the front side (negative Y-axis side of FIG. 1) of the processing station 3, and the second processing block G2 is provided on the rear side (positive Y-axis side of FIG. 1) of the processing station 3. Further, the third processing block G3 is disposed on the carry-in/out station 2 side (negative X-axis side of FIG. 1) of the processing station 3.

Provided in the first processing block G1 is a surface modifying apparatus 30 configured to modify the bonding surface W1j of the upper wafer W1 and the bonding surface W2j of the lower wafer W2. The surface modifying apparatus 30 cuts a $SiO_2$ bond on the bonding surfaces W1j and W2j of the upper and lower wafers W1 and W2 into a single bond of SiO, thus allowing the bonding surfaces W1j and W2j to be modified such that they are easily hydrophilized afterwards.

In the surface modifying apparatus 30, an oxygen gas or a nitrogen gas as a processing gas is excited into plasma to be ionized under, for example, a decompressed atmosphere. As these oxygen ions or nitrogen ions are radiated to the bonding surface W1j of the upper wafer W1 and the bonding surface W2j of the lower wafer W2, the bonding surfaces W1j and W2j are plasma-processed and modified.

Disposed in the second processing block G2 are a surface hydrophilizing apparatus 40 and a bonding apparatus 41. The surface hydrophilizing apparatus 40 is configured to hydrophilize and clean the bonding surfaces W1j and W2j of the upper wafer W1 and the lower wafer W2 with, for example, pure water. In the surface hydrophilizing apparatus 40, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused on the bonding surface W1j of the upper wafer W1 or the bonding surface W2j of the lower wafer W2, so that the bonding surfaces W1j and W2j are hydrophilized.

The bonding apparatus 41 is configured to bond the upper wafer W1 and the lower wafer W2, which are hydrophilized, by an intermolecular force. A specific configuration of the bonding apparatus 41 will be discussed later.

As shown in FIG. 2, in the third processing block G3, transition (TRS) devices 50 and 51 for the upper wafers W1, the lower wafers W2, and the combined wafers T are arranged in two levels in sequence from the bottom.

Further, as depicted in FIG. 1, a transfer section 60 is formed in a region surrounded by the first processing block G1, the second processing block G2 and the third processing block G3. A transfer device 61 is disposed in the transfer section 60. The transfer device 61 is equipped with, for example, a transfer arm which is configured to be movable in a vertical direction and a horizontal direction and pivotable around a vertical axis. This transfer device 61 is moved within the transfer section 60 to transfer the upper wafers W1, the lower wafers W2, and the combined wafers T to preset apparatuses within the first processing block G1, the second processing block G2 and the third processing block G3 which are adjacent to the transfer section 60.

Further, as illustrated in FIG. 1, the bonding system 1 includes a control device 70 and an information processing device 80. The control device 70 controls an operation of the bonding system 1. The control device 70 may be implemented by, for example, a computer, and includes a CPU (Central Processing Unit) 71, a recording medium 72 such as a memory, an input interface 73, and an output interface 74. The control device 70 performs various kinds of controls by causing the CPU 71 to execute a program stored in the recording medium 72. In addition, the control device 70 receives signals from the outside through the input interface 73 and transmits signals to the outside through the output interface 74. The control device 70 is an example of an analysis unit.

Further, the program of the control device 70 may be recorded on an information recording medium and installed from this information recording medium. The information recording medium may be, by way of non-limiting example, a hard disk HD, a flexible disk FD, a compact disk CD, a magnetic optical disk MO, a memory card, or the like. Further, the program may be downloaded from a server via the Internet and installed. Details of the information processing device 80 will be described later.

Figure 4:
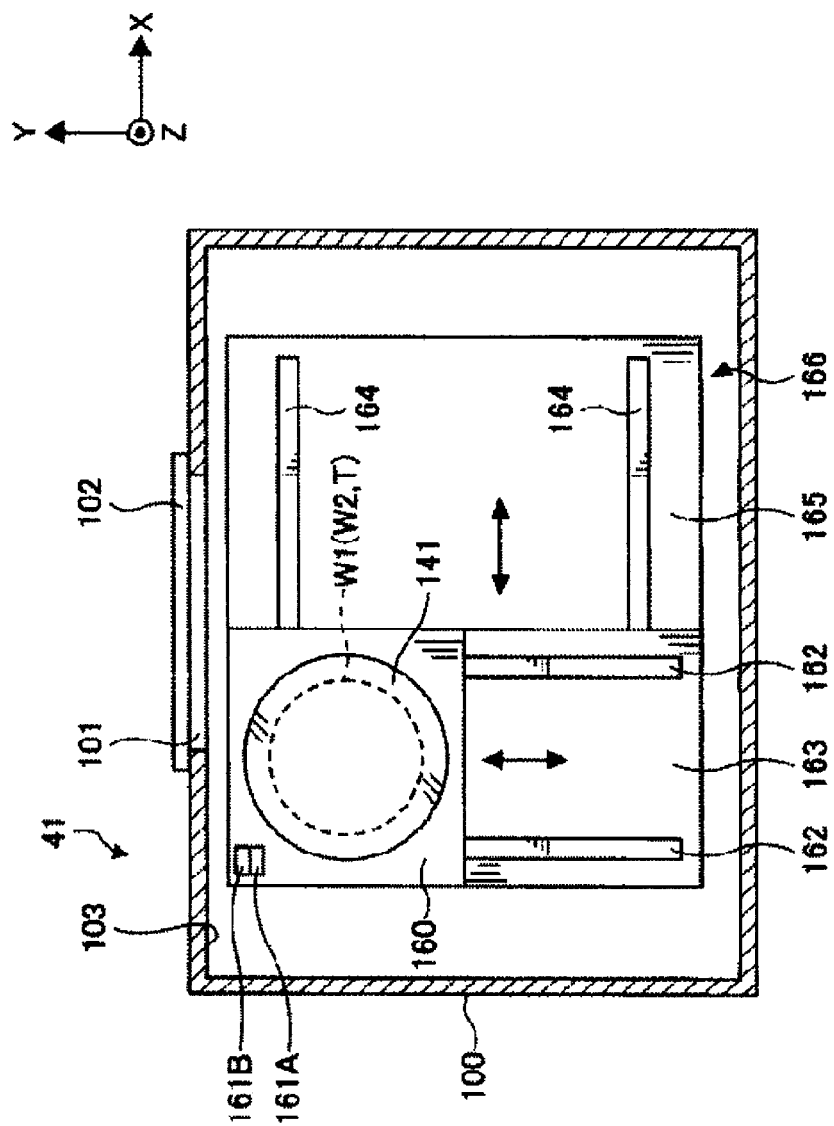
FIG. 4 is a plan view illustrating a bonding apparatus according to the exemplary embodiment.
Figure 5:
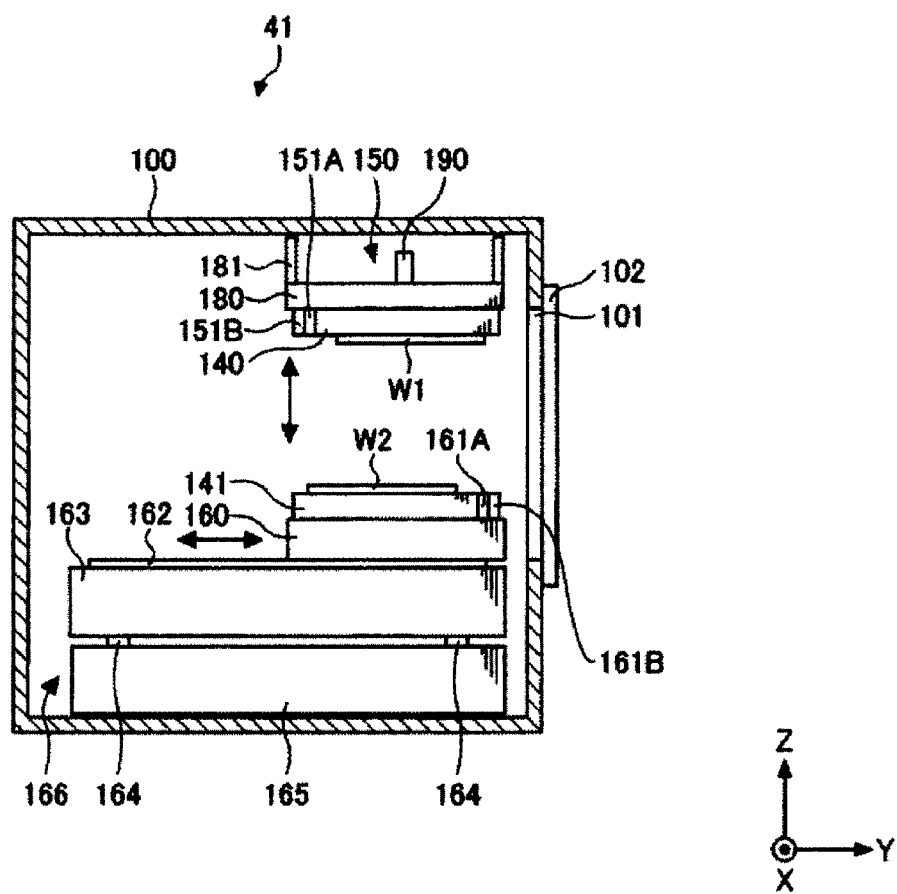
FIG. 5 is a side view illustrating the bonding apparatus according to the exemplary embodiment.

FIG. 4 is a plan view showing the bonding apparatus according to the exemplary embodiment. FIG. 5 is a side view showing the bonding apparatus according to the exemplary embodiment.

As depicted in FIG. 4, the bonding apparatus 41 has a processing vessel 100 having a hermetically sealable inside. A carry-in/out opening 101 for the upper wafer W1, the lower wafer W2 and the combined wafer T is formed in a side surface of the processing vessel 100 near the transfer section 60, and an opening/closing shutter 102 is provided at this carry-in/out opening 101. The processing vessel 100 is an example of a processing chamber.

Provided in the processing vessel 100 are an upper chuck 140 configured to attract and hold a top surface (non-bonding surface W1n) of the upper wafer W1 from above and a lower chuck 141 configured to attract and hold thereon a bottom surface (non-bonding surface W2n) of the lower wafer W2 is provided. The lower chuck 141 is provided below the upper chuck 140 and is configured to face the upper chuck 140. The upper chuck 140 and the lower chuck 141 are spaced apart from each other in a vertical direction.

As shown in FIG. 5, the upper chuck 140 is held by an upper chuck holder 150 provided above the upper chuck 140. The upper chuck holder 150 is provided on a ceiling surface of the processing vessel 100. The upper chuck 140 is fixed to the processing vessel 100 with the upper chuck holder 150 therebetween.

The upper chuck holder 150 is provided with an upper imaging unit 151A configured to image a top surface (bonding surface W2j) of the lower wafer W2 held by the lower chuck 141. As the upper imaging unit 151A, a CCD camera is used, for example. The upper chuck holder 150 is further provided with an upper displacement meter 151B configured to measure a displacement of the top surface (bonding surface W2j) of the lower wafer W2 held by the lower chuck 141. As an example, an LED displacement meter is used as the upper displacement meter 151B. The upper imaging unit 151A is an example of an imaging device, and the upper displacement meter 151B is an example of a displacement meter.

The lower chuck 141 is supported by a first lower chuck moving unit 160 provided below the lower chuck 141. The first lower chuck moving unit 160 moves the lower chuck 141 in a horizontal direction (Y-axis direction) as will be described later. Further, the first lower chuck moving unit 160 is also configured to move the lower chuck 141 in a vertical direction and to rotate the lower chuck 141 around a vertical axis.

The first lower chuck moving unit 160 is provided with a lower imaging unit 161A configured to image a bottom surface (bonding surface W1j) of the upper wafer W1 held by the upper chuck 140 (see FIG. 5). As the lower imaging unit 161A, a CCD camera is used, for example. The first lower chuck moving unit 160 is further provided with a lower displacement meter 161B configured to measure a displacement of the bottom surface (bonding surface W1j) of the upper wafer W1 held by the upper chuck 140. As an example, an LED displacement meter is used as the lower displacement meter 161B.

The first lower chuck moving unit 160 is fastened to a pair of rails 162 which is provided on the bottom side of the first lower chuck moving unit 160 and extends in a horizontal direction (Y-axis direction). The first lower chuck moving unit 160 is configured to be movable along the rails 162.

The rails 162 are provided at a second lower chuck moving unit 163. The second lower chuck moving unit 163 is fastened to a pair of rails 164 which is disposed on the bottom side of the second lower chuck moving unit 163 and extends in a horizontal direction (X-axis direction). The second lower chuck moving unit 163 is configured to be movable in the horizontal direction (X-axis direction) along the rails 164. Further, the rails 164 is disposed on a placing table 165 which is disposed on a bottom surface of the processing vessel 100.

The first lower chuck moving unit 160, the second lower chuck moving unit 163, and so forth constitute a position alignment unit 166. The position alignment unit 166 is configured to perform position alignment in the horizontal direction between the upper wafer W1 held by the upper chuck 140 and the lower wafer W2 held by the lower chuck 141 by moving the lower chuck 141 in the X-axis direction, the Y-axis direction and the θ direction. Further, the position alignment unit 166 is also configured to perform position alignment in the vertical direction between the upper wafer W1 held by the upper chuck 140 and the lower wafer W2 held by the lower chuck 141 by moving the lower chuck 141 in the Z-axis direction.

Further, although the position alignment unit 166 of the present exemplary embodiment carries out the position alignment between the upper wafer W1 and the lower wafer W2 in the horizontal direction by moving the lower chuck 141 in the X-axis direction, the Y-axis direction and the θ direction, the present disclosure is not limited thereto. The position alignment unit 166 only needs to be able to move the upper chuck 140 and the lower chuck 141 relatively to each other in the X-axis direction, the Y-axis direction, and the θ direction. By way of example, the position alignment unit 166 may perform the position alignment in the horizontal direction between the upper wafer W1 and the lower wafer W2 by moving the lower chuck 141 in the X-axis direction and the Y-axis direction and, also, by moving the upper chuck 140 in the θ direction.

Furthermore, although the position alignment unit 166 of the present disclosure carries out the position alignment between the upper wafer W1 and the lower wafer W2 in the vertical direction by moving the lower chuck 141 in the Z-axis direction, the present disclosure is not limited thereto. The position alignment unit 166 only needs to move the upper chuck 140 and the lower chuck 141 relatively to each other in the Z-axis direction. By way of example, the position alignment unit 166 may perform the position alignment between the upper wafer W1 and the lower wafer W2 in the vertical direction by moving the upper chuck 140 in the Z-axis direction.

Figure 6:
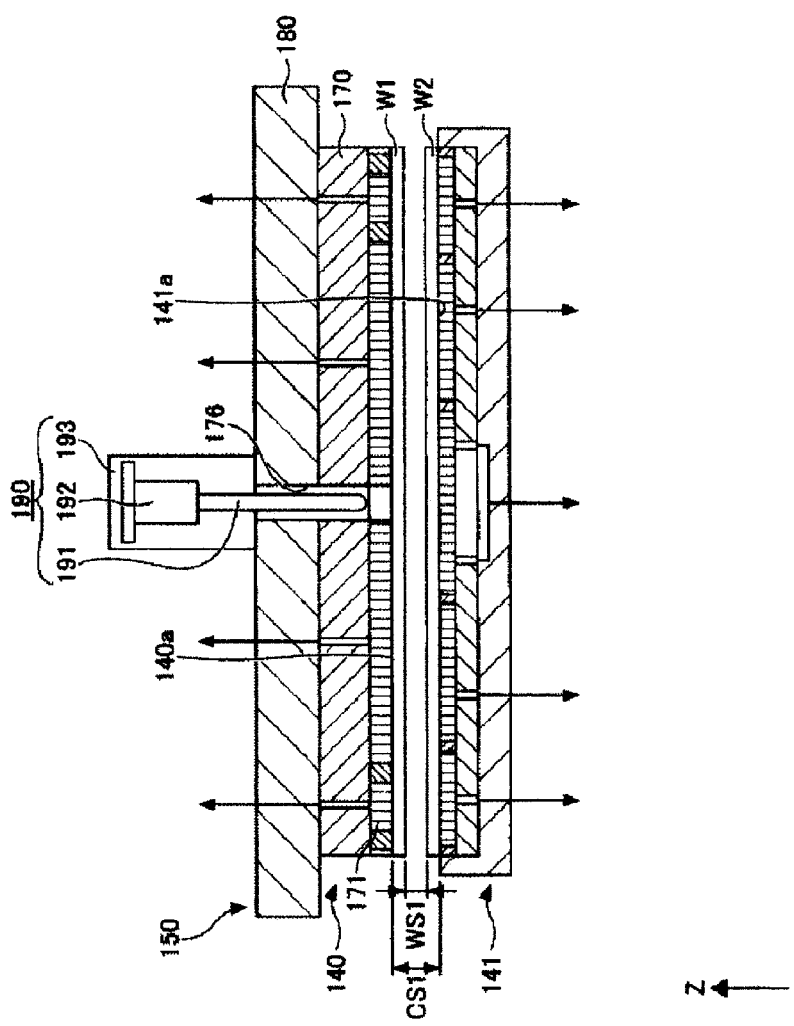
FIG. 6 is a cross sectional view illustrating an upper chuck and a lower chuck according to the exemplary embodiment, showing a state immediately before an upper wafer and a lower wafer are bonded.
Figure 7A:
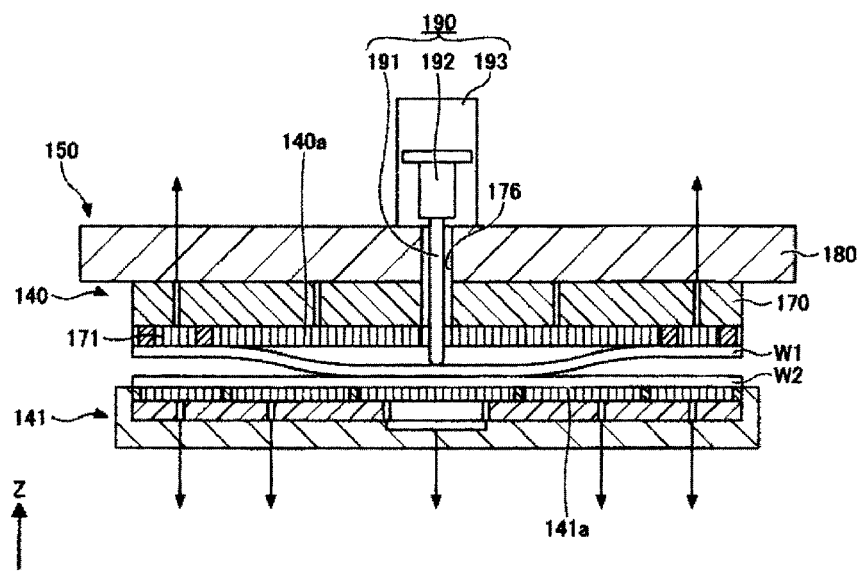
FIG. 7A and FIG. 7B are cross sectional views illustrating a state in the middle of the bonding of the upper wafer and the lower wafer according to the exemplary embodiment.
Figure 7B:
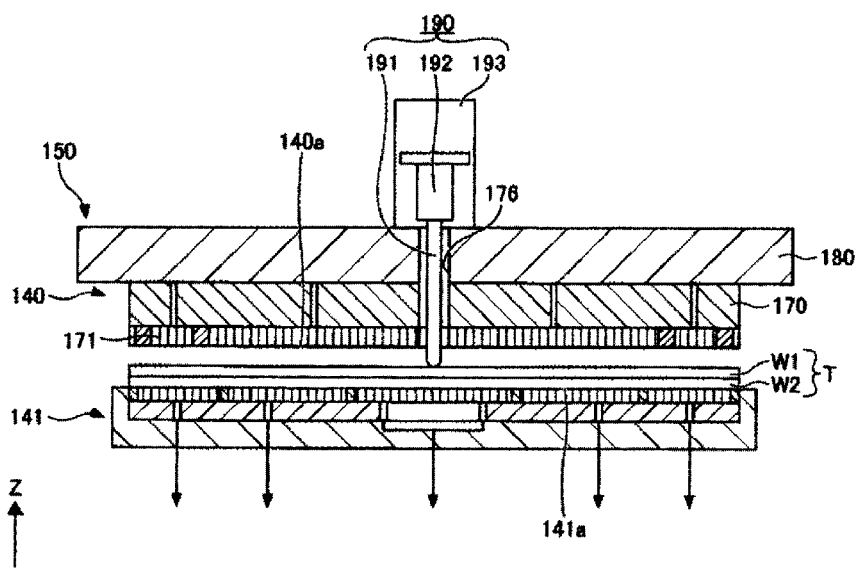

FIG. 6 is a cross sectional view illustrating the upper chuck and the lower chuck according to the exemplary embodiment, showing a state immediately before the upper wafer and the lower wafer are bonded. FIG. 7A is a cross sectional view illustrating a state in the middle of bonding between the upper wafer and the lower wafer according to the present exemplary embodiment. FIG. 7B is a cross sectional view illustrating a state upon the completion of the bonding between the upper wafer and the lower wafer according to the present exemplary embodiment. Solid-lined arrows in FIG. 6, FIG. 7A and FIG. 7B indicate a direction in which air is suctioned by a vacuum pump.

The upper chuck 140 and the lower chuck 141 are, for example, vacuum chucks. The upper chuck 140 has, at the surface (bottom surface) thereof facing the lower chuck 141, an attraction surface 140a for attracting the upper wafer W1. Meanwhile, the lower chuck 141 has, at the surface (top surface) thereof facing the upper chuck 140, an attraction surface 141a for attracting the lower wafer W2.

The upper chuck 140 has a chuck base 170. The chuck base 170 has a diameter equal to or larger than the diameter of the upper wafer W1. The chuck base 170 is supported by a supporting member 180. The supporting member 180 is disposed to cover at least the chuck base 170 when viewed from the top, and is fixed to the chuck base 170 by being screwed thereto, for example. The supporting member 180 is supported by a plurality of supporting columns 181 (see FIG. 5) provided at a ceiling surface of the processing vessel 100. The supporting member 180 and the plurality of supporting columns 181 constitute the upper chuck holder 150.

A through hole 176 is formed through the supporting member 180 and the chuck base 170 in the vertical direction. The position of the through hole 176 corresponds to a central portion of the upper wafer W1 attracted to and held by the upper chuck 140. A push pin 191 of a striker 190 is inserted into this through hole 176.

The striker 190 is provided on a top surface of the supporting member 180 and is equipped with the push pin 191, an actuator unit 192, and a linearly moving mechanism 193. The push pin 191 is a columnar member extending along the vertical direction and is supported by the actuator unit 192.

The actuator unit 192 is configured to generate a constant pressure in a certain direction (here, a vertically downward direction) by air supplied from, for example, an electro-pneumatic regulator (not shown). By the air supplied from the electro-pneumatic regulator, the actuator unit 192 is capable of controlling a press load applied to the central portion of the upper wafer W1 as it is brought into contact with the central portion of the upper wafer W1. Further, a leading end of the push pin 191 is movable up and down in the vertical direction through the through hole 176 by the air from the electro-pneumatic regulator.

The actuator unit 192 is supported at the linearly moving mechanism 193. The linearly moving mechanism 193 moves the actuator unit 192 in the vertical direction by a driving unit including, for example, a motor.

The striker 190 is configured as described above, and it controls a movement of the actuator unit 192 by the linearly moving mechanism 193 and controls the press load on the upper wafer W1 from the push pin 191 by the actuator unit 192.

The striker 190 presses the upper wafer W1 attracted to and held by the upper chuck 140 and the lower wafer W2 attracted to and held by the lower chuck 141 to bring them into contact with each other. To elaborate, the striker 190 transforms the upper wafer W1 attracted to and held by the upper chuck 140, thus brining the upper wafer W1 into contact with the lower wafer W2.

A plurality of pins 171 is provided on a bottom surface of the chuck base 170, and these pins 171 are in contact with the non-bonding surface W1n of the upper wafer W1. The upper chuck 140 is composed of the chuck base 170, the plurality of pins 171, and so forth. The attraction surface 140a of the upper chuck 140 which attracts and holds the upper wafer W1 is divided into a plurality of regions in a diametrical direction, and generation of an attracting force and release of the attracting force are performed for the divided regions individually.

Further, the lower chuck 141 may be configured in the same way as the upper chuck 140. The lower chuck 141 has a plurality of pins in contact with the non-bonding surface W2n of the lower wafer W2. The attraction surface 141a of the lower chuck 141 which attracts and holds the lower wafer W2 is divided into a plurality of regions in the diametrical direction, and generation of an attracting force and release of the attracting force are performed for the divided regions individually.

FIG. 8 is a flowchart showing a part of processings performed by the bonding system according to the exemplary embodiment. Further, various processings shown in FIG. 8 are performed under the control of the control device 70.

First, the cassette C1 accommodating the plurality of upper wafers W1, the cassette C2 accommodating the plurality of lower wafers W2, and the empty cassette C3 are placed on the preset placing plates 11 of the carry-in/out station 2. Then, the upper wafer W1 is taken out of the cassette C1 by the transfer device 22, and is transferred to the transition device 50 of the third processing block G3 of the processing station 3.

Subsequently, the upper wafer W1 is transferred to the surface modifying apparatus 30 of the first processing block G1 by the transfer device 61. In the surface modifying apparatus 30, the oxygen gas as the processing gas is excited into plasma to be ionized under the preset decompressed atmosphere. The oxygen ions are radiated to the bonding surface W1j of the upper wafer W1, and the bonding surface W1j is plasma-processed. As a result, the bonding surface W1j of the upper wafer W1 is modified (process S101).

Thereafter, the upper wafer W1 is transferred to the surface hydrophilizing apparatus 40 of the second processing block G2 by the transfer device 61. In the surface hydrophilizing apparatus 40, while rotating the upper wafer W1 held by the spin chuck, the pure water is supplied to the upper wafer W1. The supplied pure water is diffused on the bonding surface W1j of the upper wafer W1, and hydroxyl groups (silanol groups) adhere to the bonding surface W1j of the upper wafer W1 modified in the surface modifying apparatus 30, so that the bonding surface W1j is hydrophilized (process S102). Further, the bonding surface W1j of the upper wafer W1 is cleaned by the pure water used to hydrophilize the bonding surface W1j.

Next, the upper wafer W1 is transferred to the bonding apparatus 41 of the second processing block G2 by the transfer device 61 (process S103). At this time, the upper wafer W1 is transferred with its front and rear surfaces inverted. That is, the bonding surface W1j of the upper wafer W1 is turned to face downwards.

Thereafter, the transfer arm of the transfer device 61 is moved to below the upper chuck 140 in the bonding apparatus 41. Then, the upper wafer W1 is handed over to the upper chuck 140 from the transfer arm. The upper wafer W1 is attracted to and held by the upper chuck 140 so that the non-bonding surface W1n is in contact with the upper chuck 140 (process S104).

While the above-described processes S101 to S104 are being performed on the upper wafer W1, a processing of the lower wafer W2 is performed. First, the lower wafer W2 is taken out of the cassette C2 by the transfer device 22, and transferred to the transition device 50 of the processing station 3.

Next, the lower wafer W2 is transferred to the surface modifying apparatus 30 by the transfer device 61, and the bonding surface W2j of the lower wafer W2 is modified (process S105). Further, the modification of the bonding surface W2j of the lower wafer W2 in the process S105 is the same as the above-described process S101.

Thereafter, the lower wafer W2 is transferred to the surface hydrophilizing apparatus 40 by the transfer device 61, and the bonding surface W2j of the lower wafer W2 is hydrophilized (process S106). Further, the bonding surface W2j is cleaned by the pure water used to hydrophilize the bonding surface W2j. The hydrophilization of the bonding surface W2j of the lower wafer W2 in the process S106 is the same as the hydrophilization of the bonding surface W1j of the upper wafer W1 in the above-described process S102.

Afterwards, the lower wafer W2 is transferred to the bonding apparatus 41 by the transfer device 61 (process S107).

Subsequently, the transfer arm of the transfer device 61 is moved to above the lower chuck 141 in the bonding apparatus 41. Then, the lower wafer W2 is handed over to the lower chuck 141 from the transfer arm. The lower wafer W2 is attracted to and held by the lower chuck 141 so that the non-bonding surface W2n is in contact with the lower chuck 141 (process S108).

Next, the position alignment in the horizontal direction between the upper wafer W1 held by the upper chuck 140 and the lower wafer W2 held by the lower chuck 141 is carried out (process S109). In this position alignment, alignment marks W1a, W1b, and W1c previously formed on the bonding surface W1j of the upper wafer W1 and alignment marks W2a, W2b, and W2c previously formed on the bonding surface W2j of the lower wafer W2 are used.

Thereafter, the position alignment in the vertical direction between the upper wafer W1 held by the upper chuck 140 and the lower wafer W2 held by the lower chuck 141 is performed (process S110). Specifically, the position alignment unit 166 moves the lower chuck 141 vertically upwards to bring the lower wafer W2 closer to the upper wafer W1. As a result, as shown in FIG. 6, a distance WS1 between the bonding surface W2j of the lower wafer W2 and the bonding surface W1j of the upper wafer W1 is adjusted to a predetermined distance of, e.g., 50 µm to 200 µm. For example, the distance WS1 may be measured by the upper displacement meter 151B and the lower displacement meter 161B.

Next, after releasing the attracting and holding of the upper wafer W1 by the upper chuck 140 (process S111), the push pin 191 of the striker 190 is lowered, thus allowing the central portion of the upper wafer W1 to be pressed down, as illustrated in FIG. 7A (process S112). If the central portion of the upper wafer W1 comes into contact with a central portion of the lower wafer W2 and the central portions of the upper and lower wafers W1 and W2 are pressed against each other with a preset force, the pressed central portions of the upper and lower wafers W1 and W2 are begun to be bonded. Then, a bonding wave is generated, so that the upper wafer W1 and the lower wafer W2 are gradually bonded from the central portions toward peripheral portions thereof.

Here, since the bonding surface W1j of the upper wafer W1 and the bonding surface W2j of the lower wafer W2 are modified in the processes S101 and S105, respectively, a Van der Waals force (intermolecular force) is generated between the bonding surfaces W1j and W2j, so that the bonding surfaces W1j and W2j are bonded to each other. Further, since the bonding surface W1j of the upper wafer W1 and the bonding surface W2j of the lower wafer W2 are hydrophilized in the processes S102 and S106, respectively, hydrophilic groups between the bonding surfaces W1j and W2j are hydrogen-bonded, so that the bonding surfaces W1j and W2j are firmly bonded to each other.

Thereafter, while pressing the central portion of the upper wafer W1 and the central portion of the lower wafer W2 with the push pin 191, the attracting and holding of the entire upper wafer W1 by the upper chuck 140 is released (process S113). Accordingly, as shown in FIG. 7B, the entire bonding surface W1j of the upper wafer W1 and the entire bonding surface W2j of the lower wafer W2 come into contact with each other, and the upper wafer W1 and the lower wafer W2 are bonded. Then, the push pin 191 is raised up to the upper chuck 140, and the attracting and holding of the lower wafer W2 by the lower chuck 141 is released.

Subsequently, the combined wafer T is transferred to the transition device 51 of the third processing block G3 by the transfer device 61, and then is transferred to the cassette C3 by the transfer device 22 of the carry-in/out station 2. Through these processes, the series of operations of the bonding processing are completed.

In the middle of the processing illustrated in FIG. 8, for example, after the lower chuck 141 attracts and holds the lower wafer W2 (process S108), inspection of a foreign matter is performed before the position alignment between the upper wafer W1 and the lower wafer W2 in the horizontal direction (process S109) is performed. In the process of approaching and bonding the upper wafer W1 and the lower wafer W2 as shown in FIG. 6, assume that, for example, the lower wafer W2 is attracted to and held by the lower chuck 141 in the state that a foreign matter is attached to the non-bonding surface W2n. In this case, the lower wafer W2 is bent, having a bulge. For this reason, a void is formed between the lower wafer W2 and the upper wafer W1. In the following, a method of determining the type of the foreign matter will be described.

The information processing device 80 shown in FIG. 1 performs a processing of determining the type of the foreign matter. The information processing device 80 includes a controller 81 configured to control the entire device, an interface unit 82, a peak detector 83, a pre-processing unit 84, a distribution specifying unit 85, and a recording medium reader 86, a determination unit 87, a memory 88, and a storage unit 89. The storage unit 89 stores therein a computer program 90.

The controller 81 may include a CPU (Central Processing Unit), a MPU (Micro-Processing Unit), a GPU (graphics processing unit), and so forth. The controller 81 is capable of performing a preset processing by the computer program 90. That is, the processing by the controller 81 is also a processing by the computer program 90.

The peak detector 83, the pre-processing unit 84, the distribution specifying unit 85, and the determination unit 87 may be implemented by hardware or software (computer program 90), or may be implemented by both hardware and software. The information processing device 80 may be composed of multiple devices.

The memory 88 may be implemented by a semiconductor memory such as a SRAM (Static Random Access Memory), a DRAM (Dynamic Random Access Memory), a flash memory, or the like. By deploying the computer program 90 in the memory 88, the controller 81 is capable of executing the computer program 90.

The storage unit 89 may be implemented by, for example, a hard disk or a semiconductor memory, and is capable of storing therein necessary information (for example, data in the middle of a processing by the information processing device 80, a processing result, etc.).

The recording medium reader 86 may be implemented by, for example, an optical disk driver. The computer program 90 (program product) recorded on the recording medium 91 (for example, an optically readable disk storage medium such as a CD-ROM) may be read by the recording medium reader 86 and stored in the storage unit 89. The computer program 90 is deployed in the memory 88 and executed by the controller 81. Further, the computer program 90 may be downloaded from an external device and stored in the storage unit 89.

The interface unit 82 has a function as an acquisition unit, and acquires displacement data of a plurality of positions on a surface (for example, the bonding surface W2j) of a substrate (for example, the lower wafer W2) held by a chuck (for example, the lower chuck 141).

Figure 9:
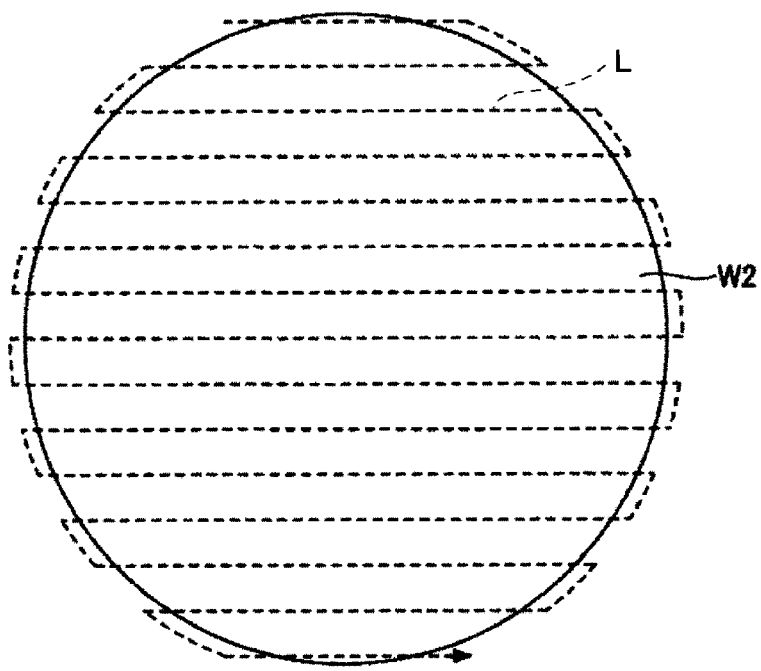
FIG. 9 is a diagram illustrating an example method of observing a bonding surface of the lower wafer according to the exemplary embodiment.

FIG. 9 is a diagram illustrating an example of a method of observing the bonding surface W2j of the lower wafer W2 according to the exemplary embodiment. As depicted in FIG. 9, while scanning the entire top surface (bonding surface W2j) of the lower wafer W2, the upper displacement meter 151B measures a displacement (height) of the bonding surface W2j of the lower wafer W2 in the Z-axis direction. Specifically, the scanning is performed to include each line L of the lower wafer W2 and the vicinity of the edge of the lower wafer W2. The interface unit 82 acquires displacement data from the upper displacement meter 151B.

Figure 10A:
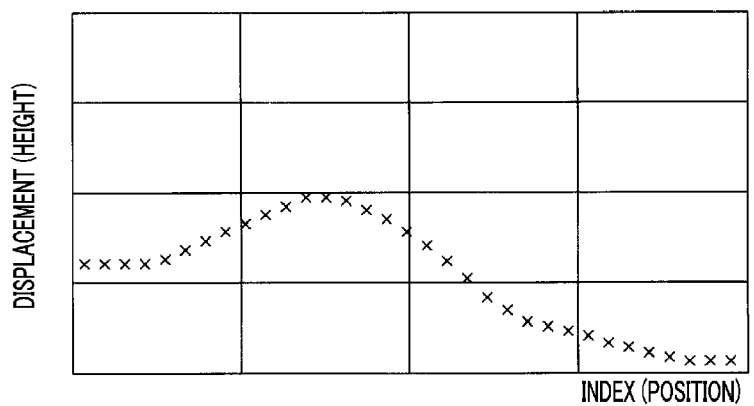
Figure 10B:
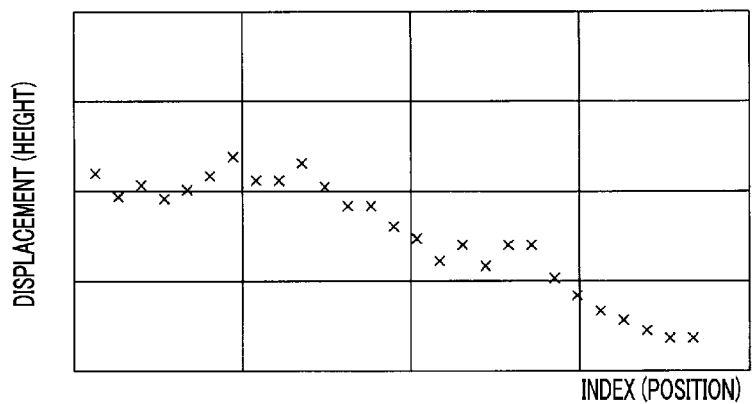

FIG. 10A and FIG. 10B are diagrams illustrating an example of displacement data according to the exemplary embodiment. In the drawings, a vertical axis represents a displacement (height) of the top surface of the lower wafer W2, and a horizontal axis represents an index (position), which is a displacement measurement point. FIG. 10A and FIG. 10B show displacement data of a single line L of the lower wafer W2, for example. FIG. 10A shows a case where a foreign matter is attached to the bottom surface (non-bonding surface W2n) of the lower wafer W2, and FIG. 10B shows a case where the lower chuck 141 is inclined (a case different from the one where the foreign matter exists on the bottom surface of the lower wafer W2).

As illustrated in FIG. 10A and FIG. 10B, in any of these two cases, a distribution of the displacement data shows that the lower wafer W2 is distorted over a wide range of the top surface thereof, and, thus, bulges are formed at the lower wafer W2. However, as shown in FIG. 10A and FIG. 10B, only with the distortion and the bulging of the top surface of the lower wafer W2, it is not possible to determine whether it is due to the foreign matter existing on the bottom surface (non-bonding surface W2n) of the lower wafer W2 or an abnormality other than the foreign matter. As will be described below, according to the information processing device 80 of the present exemplary embodiment, the type of the foreign matter can be determined.

Figure 11:
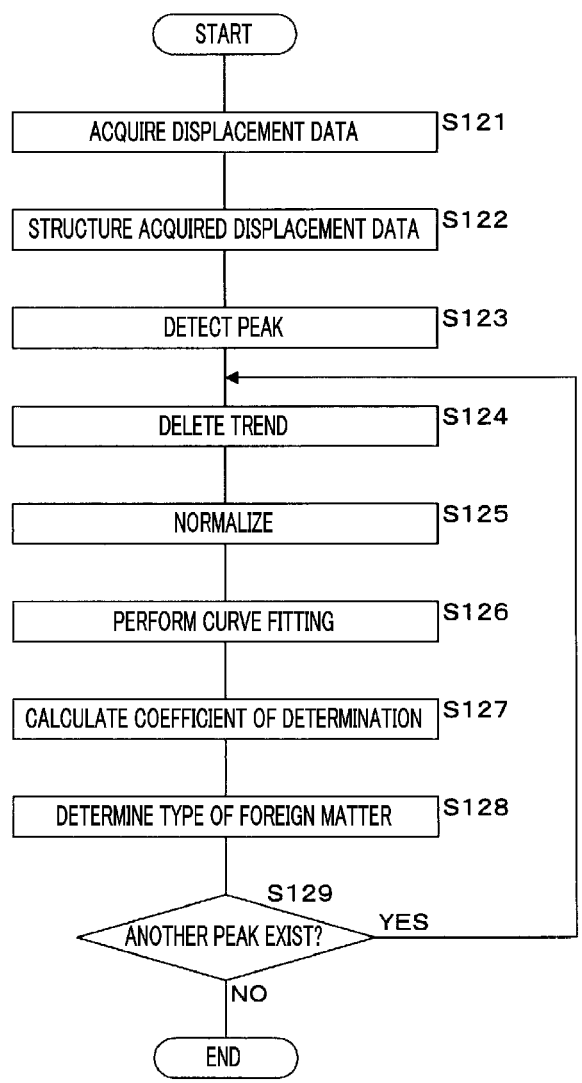
FIG. 11 is a diagram illustrating an example of a processing sequence of an information processing device according to the exemplary embodiment.

FIG. 11 is a diagram showing an example of a processing sequence of the information processing device 80 according to the exemplary embodiment. For convenience's sake, in the following description, the controller 81 is assumed to be a subject that performs a processing. The controller 81 acquires the displacement data of the top surface (front surface) of the lower wafer W2 (S121), and structures the acquired displacement data (S122). The structuring of the displacement data is a process of excluding data other than information on the top surface of the lower wafer W2 from the displacement data. The controller 81 performs peak detection on the displacement data (S123).

Figures 12A, 12B:
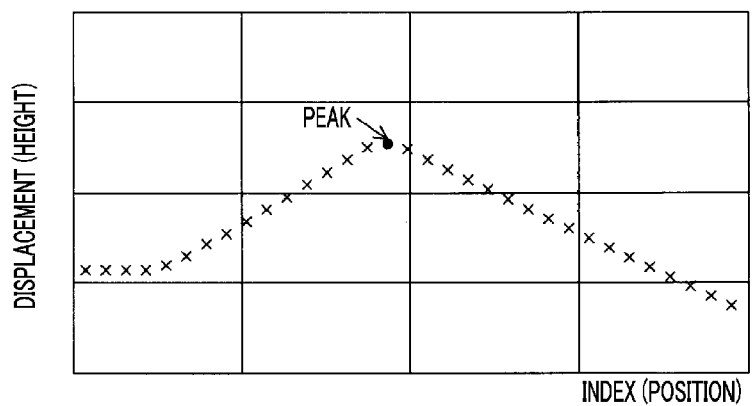
FIG. 12A and FIG. 12B are diagrams illustrating examples of peak detection according to the exemplary embodiment.

FIG. 12A and FIG. 12B are diagrams showing an example of the peak detection according to the exemplary embodiment. The peak detector 83 detects a peak by specifying a local maximum of the displacement data for each line L of the lower wafer W2. In this way, the peak detector 83 performs the peak detection for all measurement points of the lower wafer W2. In the peak detection, a point where the displacement becomes the maximum among the displacements of the measurement points of the single line L is detected as the peak. In other words, when a plurality of local maxima exist, the maximum of the local maxima is detected as the peak. That is, when all the points before and after a certain peak determination point are small, that peak determination point is detected as the peak. As a result, as shown in FIG. 12B, even when the plurality of local maxima exist, the peak can be accurately detected.

The controller 81 performs trend deletion as a pre-process (S124).

Figure 13A:
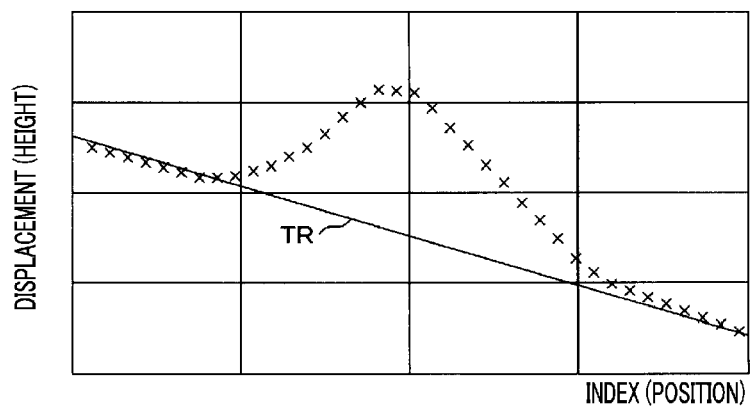
FIG. 13A and FIG. 13B are diagrams illustrating examples of trend deletion according to the exemplary embodiment.
Figure 13B:
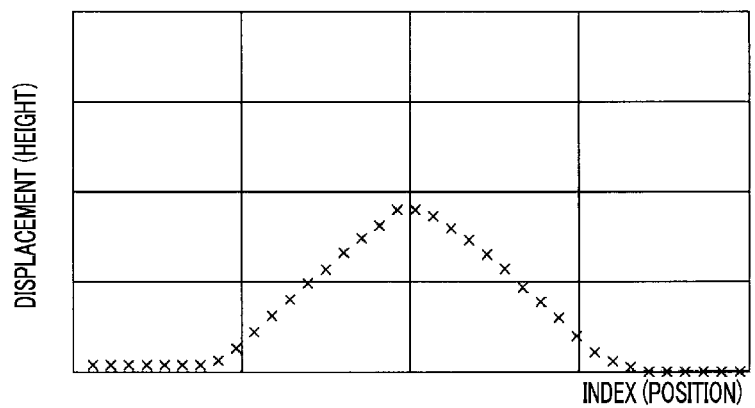

FIG. 13A and FIG. 13B are diagrams illustrating an example of the trend deletion according to the exemplary embodiment. The pre-processing unit 84 determines the presence or absence of a gradient component (trend) of the displacement data. If there is the gradient component, the pre-processing unit 84 deletes the gradient component from the displacement data. FIG. 13A shows displacement data before the trend deletion, and FIG. 13B shows displacement data after the trend deletion. The trend deletion is accomplished by deleting the gradient component (displacement component of a line segment TR in the drawing) from the displacement data. By performing this trend deletion, the type of the foreign matter can be determined with high precision. Further, although the examples of FIG. 13A and FIG. 13B show a downward trend that goes lower to the right, the trend is not limited thereto, and there may be a downward trend that goes lower to the left.

The controller 81 performs normalization as a pre-process (S125).

Figure 14B:
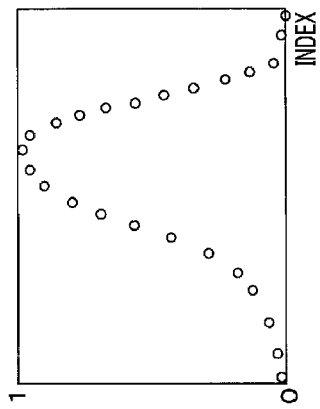
FIG. 14A to FIG. 14C are diagrams illustrating examples of normalization according to the exemplary embodiment.
Figure 14C:
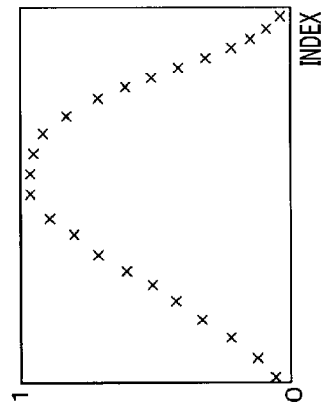
Figure 14A:
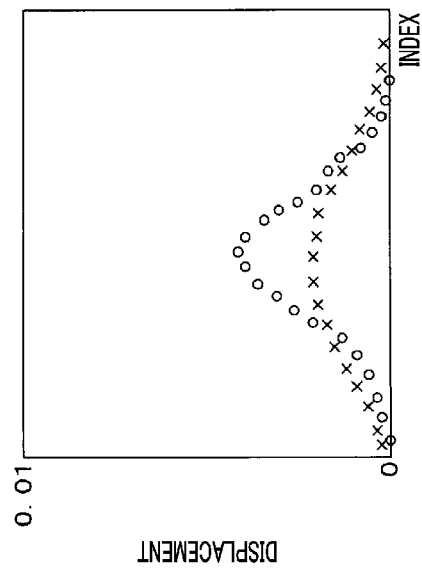

FIG. 14A to FIG. 14C are diagrams illustrating an example of the normalization according to the exemplary embodiment. The pre-processing unit 84 normalizes the displacement data. FIG. 14A shows two displacement data (indicated by signs O and X) before the normalization. FIG. 14B shows normalized displacement data of the sign O, where the displacement data for each index is normalized in the range of 0 to 1. FIG. 14C shows normalized displacement data of the sign X, where the displacement data for each index is normalized in the range of 0 to 1. The two displacement data having different peaks of displacements are converted into displacement data having a peak of 1, and it is possible to arrange the displacements as the criterion for the determination while maintaining the shape of the distribution of the displacement data.

The controller 81 performs curve fitting (S126). The curve fitting is a process of performing regression analysis on the displacement data to generate a regression model. In the present exemplary embodiment, a factor is searched for such that the displacement data is fitted to a Gaussian distribution. The Gaussian distribution (f(x)) can be expressed as $f(x)=a \times \exp\{-(x-\mu)^2/(2\sigma^2)\}$. Here, x is a displacement, $\mu$ is an average, and $\sigma^2$ is a variance. Since the displacement data is normalized, a value of (maximum value−minimum value) of the Gaussian distribution is fixed to 1, the position corresponding to the maximum value is fixed to the index obtained by the peak detection, and the factor of the curve fitting corresponds to $2\sigma^2$.

Figure 15:
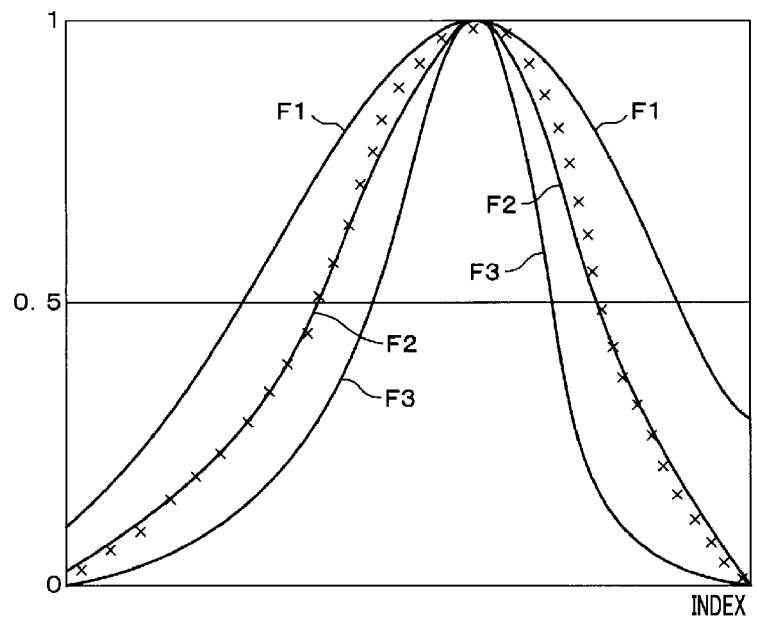
FIG. 15 is a diagram illustrating an example of curve fitting according to the exemplary embodiment.

FIG. 15 is a diagram illustrating an example of the curve fitting according to the exemplary embodiment. The distribution specifying unit 85 has a function as a specifying unit and specifies the displacement distribution of the top surface of the lower wafer W2 based on the displacement data. As described above, in the equation representing the Gaussian distribution, the curve fitting of the Gaussian distribution is performed on the displacement data by varying the factor ($2\sigma^2$). In the example of FIG. 15, three curves indicated by signs F1, F2, and F3 are fitted to the displacement data indicated by the sign X. In the example of FIG. 15, the curve indicated by the sign F2 is the most fit. Here, the number of the curves to be fitted is not limited to three.

The controller 81 calculates a coefficient of determination (S127).

Figure 16:
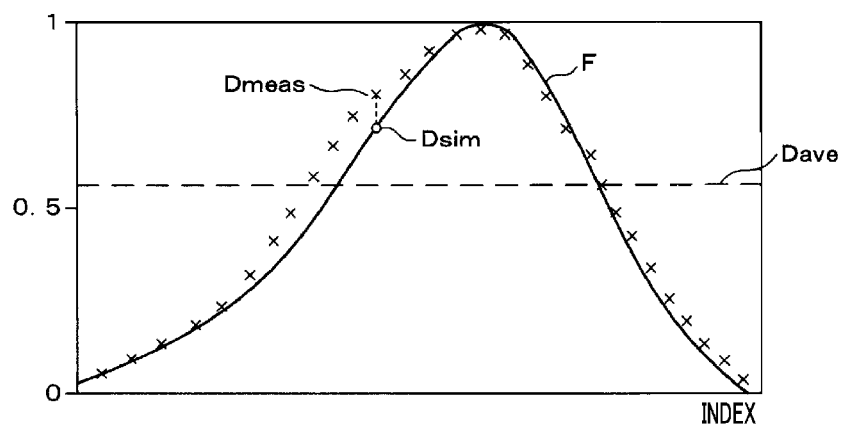
FIG. 16 is a diagram illustrating an example of determination coefficient calculation according to the exemplary embodiment.

FIG. 16 is a diagram illustrating an example of the calculation of the coefficient of determination according to the exemplary embodiment. The distribution specifying unit 85 calculates the coefficient of determination. Specifically, the distribution specifying unit 85 calculates the coefficient of determination based on a first residual sum of squares of the regression model obtained by performing the regression analysis on the displacement data and a second residual sum of squares based on the displacement data and an average of the displacement data. The coefficient of determination $R^2$ can be calculated as $R^2=[1-\{\Sigma(\text{Dmeas}-\text{Dsim})^2\}/\{\Sigma(\text{Dmeas}-\text{Dave})^2\}]$. Here, $\{\Sigma(\text{Dmeas}-\text{Dsim})^2\}$ denotes the first residual sum of squares of the regression model; Dmeas denotes the measured displacement (displacement data); and Dsim denotes the displacement fitted by the regression model. The regression model is a Gaussian model F. $\{\Sigma(\text{Dmeas}-\text{Dave})^2\}$ is the second residual sum of squares based on an average Dave of the displacement data and the displacement data Dmeas.

The coefficient of determination becomes a value between 0 to 1 inclusive. When the regression analysis, that is, the application (fitting) by the Gaussian distribution is good, the coefficient of determination becomes a large value, whereas when the application (fitting) by the Gaussian distribution is not good, the coefficient of determination becomes a small value. Thus, the distribution specifying unit 85 can determine whether the distribution of the displacement data is similar to the Gaussian distribution based on the coefficient of determination by determining whether the coefficient of determination is large or small.

The controller 81 determines the type of the foreign matter (S128). The determination unit 87 determines the type of the foreign matter based on the distribution specified by the distribution specifying unit 85. To elaborate, if the distribution specified by the distribution specifying unit 85 is similar to the Gaussian distribution, the determination unit 87 makes a determination that the foreign matter exists between the substrate (lower wafer W2) and the chuck (lower chuck 141). This suppresses the lower wafer W2 from being attracted to and held by the lower chuck 141 in the state that the foreign matter is attached to the non-bonding surface W2n of the lower wafer W2, thus suppressing the lower wafer W2 from being distorted to have the bulge which may cause the formation of the void between the lower wafer W2 and the upper wafer W1.

Figure 17A:
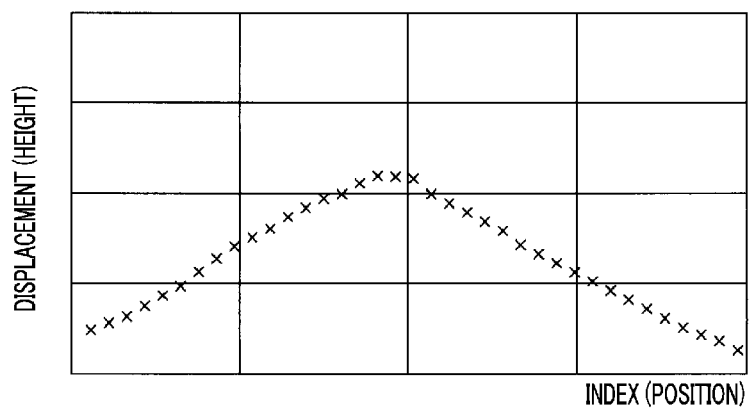
FIG. 17A and FIG. 17B are diagrams illustrating examples of a foreign matter between the lower wafer and the lower chuck according to the exemplary embodiment.
Figure 17B:
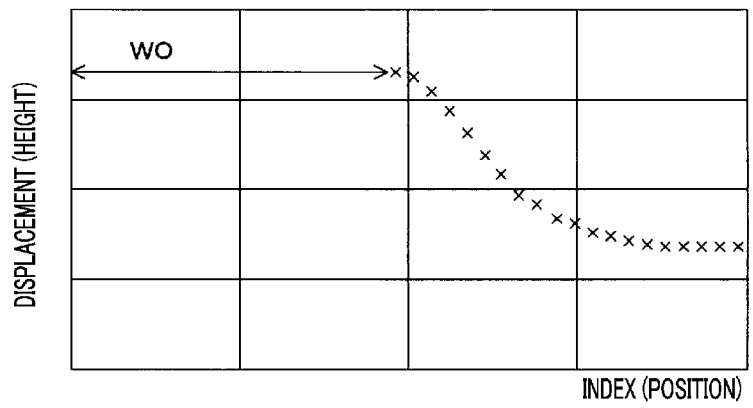

FIG. 17A and FIG. 17B are diagrams showing an example of a foreign matter between the lower wafer W2 and the lower chuck 141 according to the exemplary embodiment. FIG. 17A shows displacement data in the case where there is no inclination of the wafer and the chuck and a foreign matter exists between the lower wafer W2 and the lower chuck 141. FIG. 17B shows displacement data when a foreign matter is present at an edge of the wafer between the lower wafer W2 and the lower chuck 141. A sign WO indicates an outside of the wafer. According to the present exemplary embodiment, the determination unit 87 determines that the distribution of displacement data is similar to the Gaussian distribution, and even with the distribution of the displacement data as shown in FIG. 17A and FIG. 17B, it can be determined that the foreign matter exists between the lower wafer W2 and the lower chuck 141.

Figure 18A:
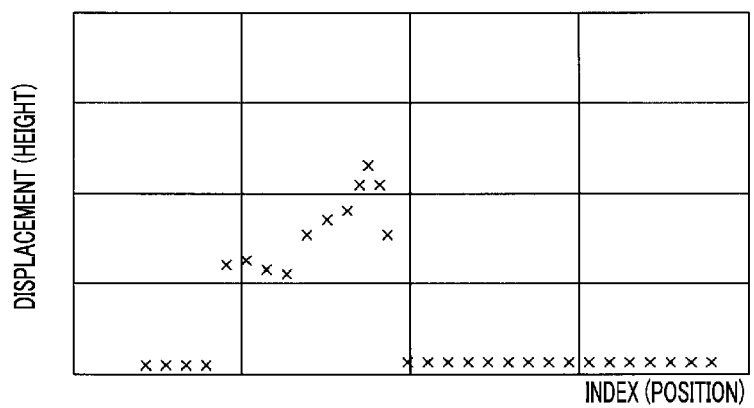
FIG. 18A and FIG. 18B are diagrams illustrating examples of an abnormality other than the foreign matter between the lower wafer and the lower chuck according to the exemplary embodiment.
Figure 18B:
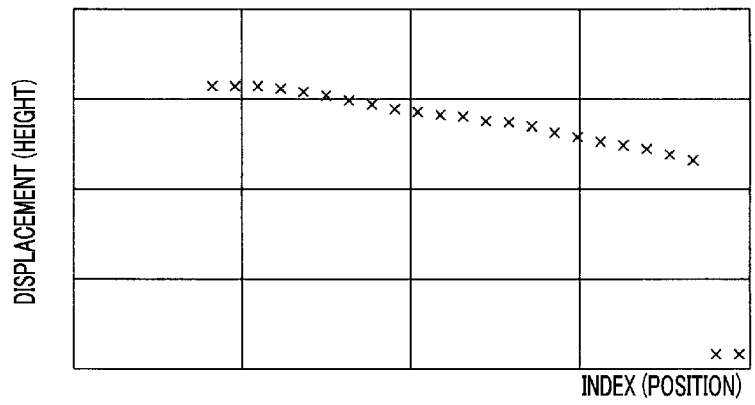

FIG. 18A and FIG. 18B are diagrams showing an example of an abnormality other than the foreign matter between the lower wafer W2 and the lower chuck 141 according to the exemplary embodiment. FIG. 18A shows displacement data when there is no foreign matter on the non-bonding surface W2n of the lower wafer W2 but there is a foreign matter on the bonding surface W2j thereof. FIG. 18B shows a case where the shape of a trim at the edge of the lower wafer W2 is abnormal data, although there is no foreign matter on the non-bonding surface W2n of the lower wafer W2. According to the present exemplary embodiment, it is possible to suppress, based on the displacement data as shown in FIG. 18A and FIG. 18B, an erroneous determination that the foreign matter exists between the lower wafer W2 and the lower chuck 141 from being made.

The controller 81 determines whether or not there is another peak (S129), and if there is another peak (YES in S129), the controller 81 continues the processing from the process S124. If there is no other peak (NO in S129), the controller 81 ends the processing.

So far, the exemplary embodiments have been described. However, the present disclosure is not limited to the exemplary embodiments, and the above-described exemplary embodiments may be modified and replaced in various ways without departing from the scope and the spirit of the appended claims.

According to the exemplary embodiment, it is possible to determine the type of the foreign matter of the substrate held by the chuck.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate bonding method, comprising:
holding substrates by a lower chuck and an upper chuck disposed apart from each other in a vertical direction;
acquiring displacement data of multiple points on a surface of the substrate held by the lower chuck;
specifying a distribution of displacements on the surface based on the acquired displacement data;
determining types of a foreign matter based on the specified distribution; and
bonding, when there exists no foreign matter, the substrates respectively held by the lower chuck and the upper chuck,
wherein the types of the foreign matter include one abnormality regarding the foreign matter existing between the substrate and the chuck, and another abnormality distinct from the foreign matter between the substrate and the chuck, and
wherein the determining the types of the foreign matter includes determining, when the distribution is similar to a Gaussian distribution, that the foreign matter exists between the substrate and the chuck.

2. A computer-readable recording medium having stored thereon computer-executable instructions that, in response to execution on a computer, cause a processing according to claim 1 to be performed,
wherein the processing comprises:
acquiring displacement data of multiple points on a surface of a substrate held by a chuck;
specifying a distribution of displacements of the surface based on the acquired displacement data; and
determining types of a foreign matter based on the specified distribution,
wherein the types of the foreign matter include one abnormality regarding the foreign matter existing between the substrate and the chuck, and another abnormality that is distinct from the foreign matter between the substrate and the chuck, and
wherein the determining the types of the foreign matter includes determining, when the distribution is similar to a Gaussian distribution, that the foreign matter exists between the substrate and the chuck.

3. The computer-readable recording medium of claim 2, wherein the processing further comprises:
calculating a coefficient of determination based on a first residual sum of squares of a regression model obtained by performing regression analysis on the displacement data and a second residual sum of squares based on the displacement data and an average of the displacement data; and
determining whether the distribution is similar to the Gaussian distribution based on the calculated coefficient of determination.

4. The computer-readable recording medium of claim 2, wherein the processing further comprises:
specifying a local maximum of the displacement data; and
specifying the distribution having the specified local maximum as a peak.

5. The computer-readable recording medium of claim 2, wherein the processing further comprises:
determining presence or absence of a gradient component of the displacement data; and
specifying, when there is the gradient component, the distribution of the displacements of the surface based on the displacement data from which the gradient component is deleted.

6. The computer-readable recording medium of claim 2, wherein the processing further comprises:
normalizing the displacement data; and
specifying the distribution of the displacements of the surface based on the normalized displacement data.

7. The computer-readable recording medium of claim 2, wherein the surface of the substrate includes a first surface between the substrate and the chuck and a second surface opposite to the first surface,
wherein said another abnormality distinct from the foreign matter between the substrate and the chuck includes the foreign matter existing on the second surface of the substrate.

8. The computer-readable recording medium of claim 2, wherein said another abnormality distinct from the foreign matter between the substrate and the chuck includes an abnormality regarding a shape of a trim at an edge of the substrate.

9. A substrate bonding system, comprising:
a bonding apparatus equipped with a lower chuck and an upper chuck disposed apart from each other in a vertical direction, and configured to bond a substrate held by the lower chuck and a substrate held by the upper chuck; and
an information processing device,
wherein the information processing device comprises:
an acquisition unit configured to acquire displacement data of multiple points on a surface of the substrate held by the lower chuck;
a specifying unit configured to specify a distribution of displacements of the surface based on the acquired displacement data; and
a determination unit configured to determine types of a foreign matter based on the specified distribution,
wherein the types of the foreign matter include one abnormality regarding the foreign matter existing between the substrate and the chuck, and another abnormality distinct from the foreign matter between the substrate and the chuck, and
wherein the determination unit is configured to determine, when the distribution is similar to a Gaussian distribution, that the foreign matter exists between the substrate and the chuck.

* * * * *